United States Patent
Oh et al.

[11] Patent Number: 5,875,149
[45] Date of Patent: Feb. 23, 1999

[54] WORD LINE DRIVER FOR SEMICONDUCTOR MEMORIES

[75] Inventors: Jong-Hoon Oh, Fremont; Joon-Ho Kim, San Jose; Jinyong Chung, Los Altos Hills, all of Calif.

[73] Assignee: Hyndai Electronics America, San Jose, Calif.

[21] Appl. No.: 828,817

[22] Filed: Feb. 6, 1997

[51] Int. Cl.[6] .................................................. G11C 8/00
[52] U.S. Cl. ........................ 365/230.06; 365/72; 365/63
[58] Field of Search ............................... 365/230.06, 72, 365/207, 208, 63, 154

[56] References Cited

U.S. PATENT DOCUMENTS

| | | | |
|---|---|---|---|
| 4,747,082 | 5/1988 | Minato et al. | 365/230.06 |
| 4,782,465 | 11/1988 | Uchida | 365/72 |
| 4,914,630 | 4/1990 | Fujishima et al. | 365/230.03 |
| 4,967,396 | 10/1990 | Kajigaya et al. | 365/207 |
| 5,005,068 | 4/1991 | Ikeda et al. | 365/63 |
| 5,083,294 | 1/1992 | Okajima | 365/230.03 |
| 5,122,857 | 6/1992 | Ikeda et al. | 365/63 |
| 5,132,928 | 7/1992 | Hayashikoshi et al. | 365/63 |
| 5,172,335 | 12/1992 | Sasaki et al. | 365/63 |
| 5,193,074 | 3/1993 | Anami | 365/230.03 |
| 5,239,196 | 8/1993 | Ikeda et al. | 365/154 |
| 5,268,587 | 12/1993 | Murata et al. | 365/63 |

OTHER PUBLICATIONS

M. Horenstein, "Microelectronic Circuits and Devices," ©1990 Prentice–Hall, Inc., TK 7874, #675, pp. 729–747, 758.

*Primary Examiner*—A. Zarabian
*Attorney, Agent, or Firm*—Townsend and Townsend and Crew LLP

[57] ABSTRACT

A hierarchical word line driving structure is disclosed that uses a single global word line and low power sub-word line driver circuits that are relatively small in size. Higher density memory cell arrays are made possible by inverting the signal on a global word line inside each sub-word line driver circuit.

14 Claims, 8 Drawing Sheets

WORD LINE DRIVER FOR SEMICONDUCTOR MEMORIES

BACKGROUND OF THE INVENTION

The present invention relates in general to semiconductor memories, and in particular to an improved word line driving structure that reduces power consumption and chip area.

Semiconductor memory circuits are made up of one or more memory arrays each including memory cells located at intersections of rows (or word lines) and columns (or bit lines). A memory cell is accessed by asserting a word line and then selecting a bit line. A word line is selected by applying a row address signal to the memory device. The address signal is decoded by a row decoder whose output selects the addressed row. Using a dynamic random access memory (DRAM) circuit as an example, in each array, a single word line may drive 1024 or 2048 memory cell access transistors. FIG. 1 shows a simplified partial schematic of the word line structure for a conventional DRAM. In the typical example shown in FIG. 1, the output of a row decoder 100 drives four word line drivers 102-A, 102-B, 102-C, and 102-D. The output of each word line driver 102 connects to all of the gate terminals of the memory cell (104) access transistors 106 connected to that word line. The gate terminals of these access transistors are typically made of polysilicon, or variations on the polysilicon material (e.g., polycide). Thus, in a typical DRAM design, a single polysilicon line that forms the gate terminals of all memory cell access transistors common to a word line, acts as the word line.

Because of the relatively higher sheet resistance of polysilicon material, in larger arrays, metal strapping of the polysilicon word line became necessary to reduce propagation delays through the word line. A strapped polysilicon word line includes a second less resistive conductive layer, typically metal, routed over the poly layer, making contacts with the poly layer at various intervals as shown in FIG. 1. The length of the word line, silicon area consumed by the metal-to-poly contact regions, and acceptable propagation delay are among the factors that dictate the strapping intervals.

Over the years, increasingly higher density memory devices have been made possible by significant reductions in the size of the memory cell. The photo-lithography aspect of semiconductor processing technology, however, has met with more limited success. It has, therefore, not been possible to shrink the width and spacing of interconnect lines (e.g., metal lines) at the same rate as the size of the memory cell. As a result, at higher densities of, for example, 64 Megabits, the metal-to-metal spacing (or metal pitch) as required by the word line strapping technique has become the limiting factor in determining the size of the memory array. Thus, with the 64 Megabit generation of DRAMs, it became necessary to devise methods to overcome the word line metal pitch limitations.

One approach to relaxing the metal pitch requirement has been to use a hierarchical word line structure with a global (array long) metal word line driving segmented (shorter) polysilicon sub-word lines. In this structure, the word line decoder output (node N1 in FIG. 1) is used as the global word line (GWL) which is routed with its complement as a pair of metal lines across the entire array. Each segment or sub-word line is driven by a dedicated group of sub-word line drivers. Thus, each complementary pair of GWLs typically drives several groups of four sub-word line driver circuits distributed at various locations (segment intervals) across the array. With four sub-word lines thus sharing two metal lines, this structure improves word line density per metal pitch by a factor of two.

However, because this structure requires metal lines carrying complementary signals to be routed in parallel at minimum spacing, a metal-to-metal short would cause dissipation of excessive amounts of standby current. Several other techniques have since been proposed that minimize or eliminate this risk. These techniques typically route a single metal GWL across the array, and include additional circuitry at the local sub-word line driver regions to drive four polysilicon sub-word lines. The GWL signal usually requires a boosted level and the additional circuitry includes extra transistors as well as bus lines to be routed across the array. While these schemes have improved word line density per metal pitch by yet another factor of two (1 metal line shared by 4 poly word lines), the improvement has been realized at the cost of more complexity, appreciably higher power consumption, and larger silicon area.

There is therefore a need for an improved word line driving structure for memory circuits that takes less silicon area and dissipates less power.

SUMMARY OF THE INVENTION

The present invention provides a hierarchical word line driving structure that uses a single global word line and a low power sub-word line driver circuit that is relatively small in size. Broadly, the sub-word line driver circuit of the present invention includes an inverting circuit that inverts the global word line signal locally. Various embodiments for the local inverting circuit are presented with different performance trade offs. The localized inversion eliminates the need for routing a second complementary global word line across the array. The sub-word line driver circuit of the present invention dissipates lower power and meets the memory circuit speed requirements.

Accordingly, in one embodiment, the present invention provides a memory circuit including an array of memory cells each located at an intersection of a column and a row, wherein each row is divided into a plurality of segments of sub-word lines, a row decoder having inputs coupled to receive row address information and an output coupled to a global word line, a plurality of sub-word line drivers respectively located at various intervals along each row, each sub-word line driver having an input coupled to a respective global word line and an output coupled to a respective sub-word line, the sub-word line driver further including an inverting circuit for locally inverting a signal on the global word line.

In one embodiment of the present invention, the inverting element includes a pull-down device and a pull-up device. Various embodiments of the present invention use an NMOS transistor as the pull-down device with different types of pull-up elements including either a resistor, or a transistor. When using a transistor pull-up device, the present invention uses an NMOS pull-up transistor. In yet another embodiment, the present invention uses the combination of a resistor and a transistor as the pull-up device.

A better understanding of the nature and advantages of the memory circuit with hierarchical word line structure according to the present invention may be had with reference to the detailed description and the drawings below.

DESCRIPTION OF THE PREFERRED EMBODIMENT

Figure 1:
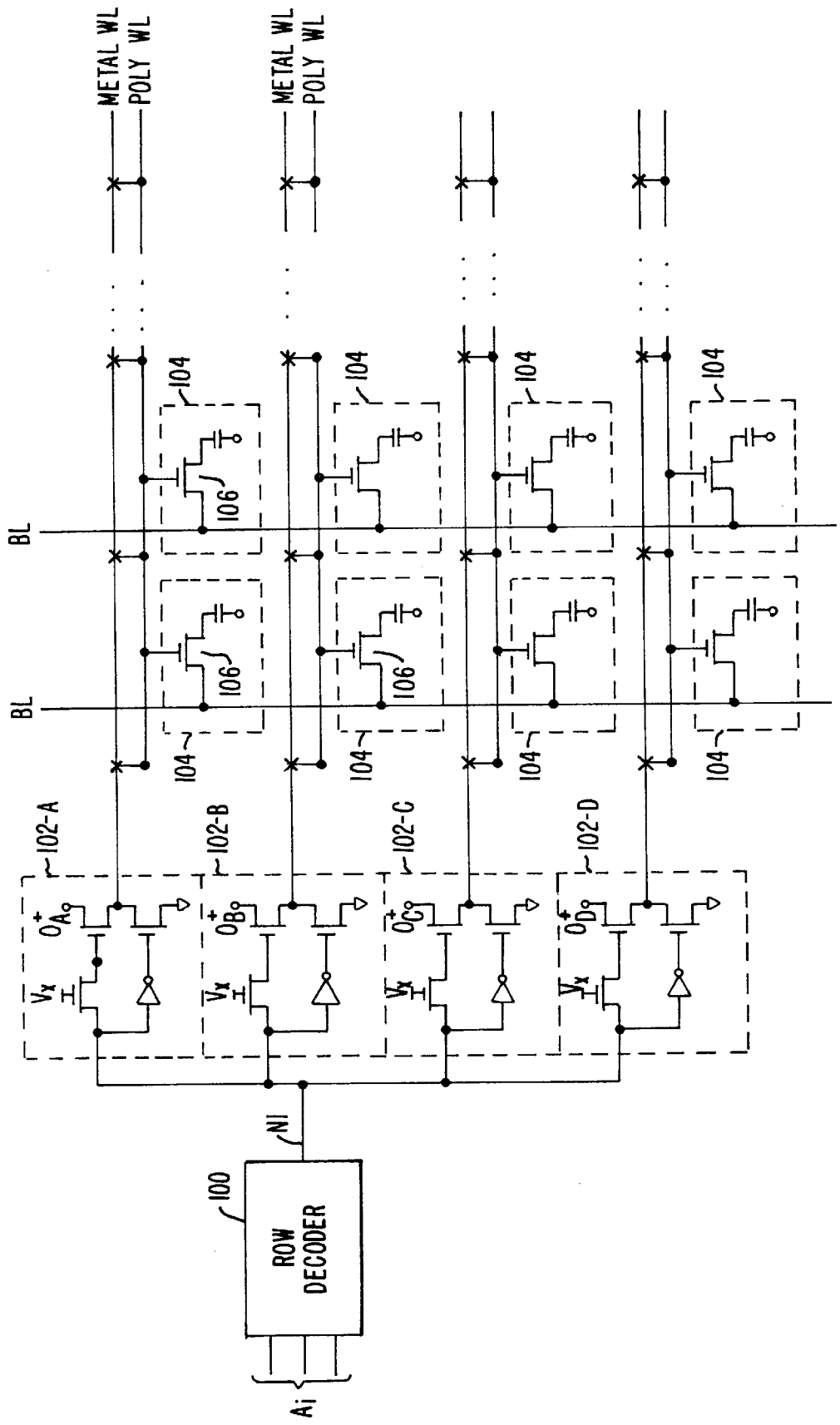
FIG. 1 shows a simplified partial schematic of the word line structure for a prior art dynamic random access memory circuit.
Figure 2:
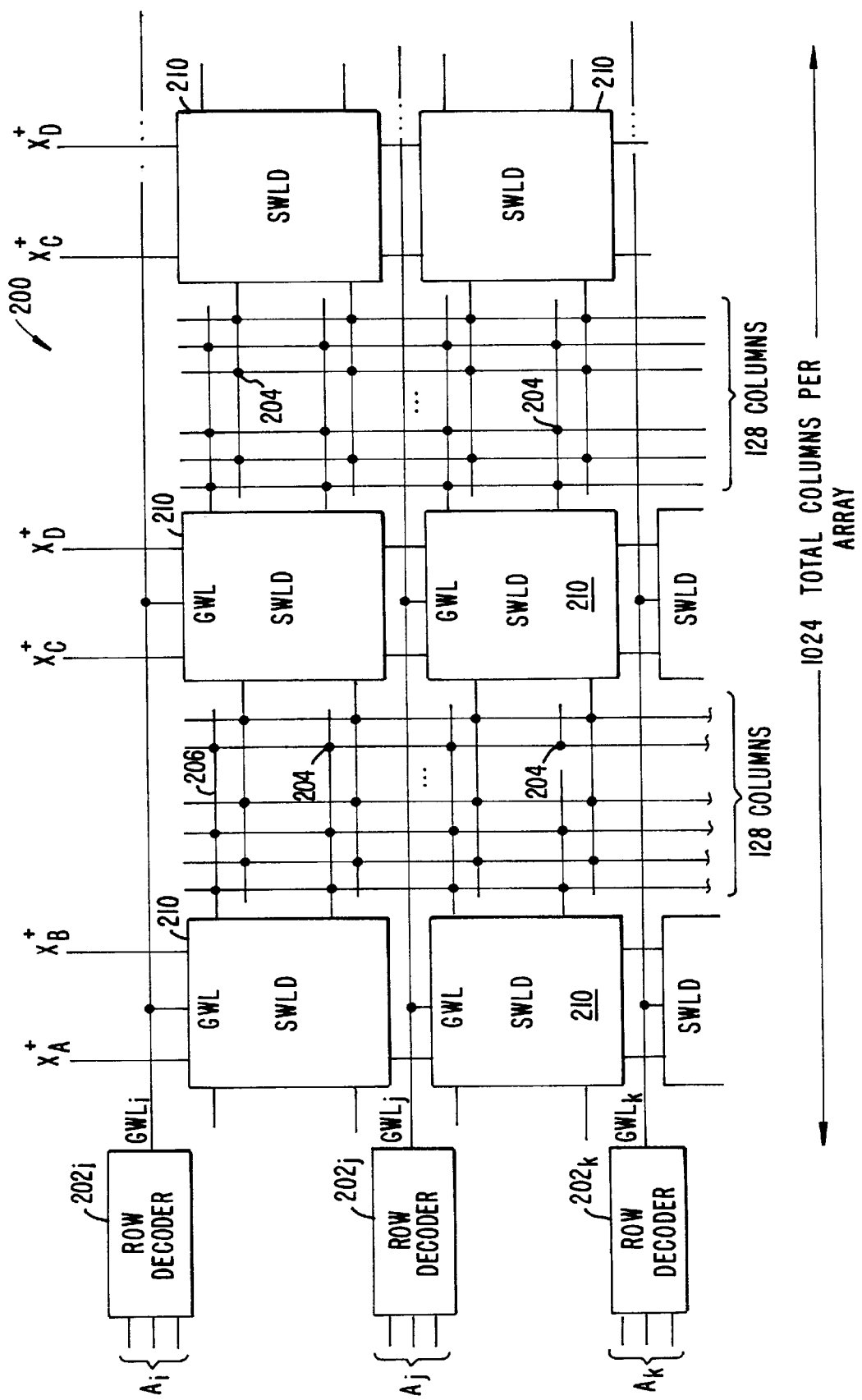
FIG. 2 is a partial schematic of the word line structure for a single array in a memory circuit according to an exemplary embodiment of the present invention.

Referring to FIG. 2, there is shown a partial schematic of an exemplary memory array 200 illustrating the hierarchical word line architecture according to an embodiment of the present invention. A row decoder $202_i$ decodes address input signals $A_i$ and generates its output on a global word line $GWL_i$. The global word line GWL traverses the entire array 200 and is made up of low resistivity conductive material such as metal. The actual polysilicon word line that connects to the gate terminals of memory cells 204, is segmented into multiple sub-word lines (SWLs) 206. For convenient depiction of the memory circuit, a memory cell 204 is represented in FIG. 2 by a small circle, but is in fact similar to memory cell 104 shown in FIG. 1. The plurality of memory cells 204 are arranged at the cross sections of sub-word lines (SWLs) 206 and bit lines or columns 208 as shown. Sub-word line driver (SWLD) circuits 210 are placed at sub-word line segment intervals. For illustrative purposes only, array 200 is for example a 256K cell array with 1024 columns 208 and 256 rows. In this exemplary embodiment, SWLD circuits 210 are located at every 128 columns. Thus, there are nine SWLD regions, with each SWLD circuit 210 driving two sub-word lines 206 on either side.

As can be seen from FIG. 2, this architecture relaxes the metal pitch requirements by accommodating four polysilicon SWLs between two metal GWLs. Further, the present invention routes a single global word line instead of a complementary pair, eliminating the risk for excessive standby currents caused by shorting interconnect lines carrying complementary signals. This is achieved by generating the complementary signal (GWL#) locally inside the SWLD circuits 210, described hereinafter in connection with FIGS. 3 through 8.

Figure 3:
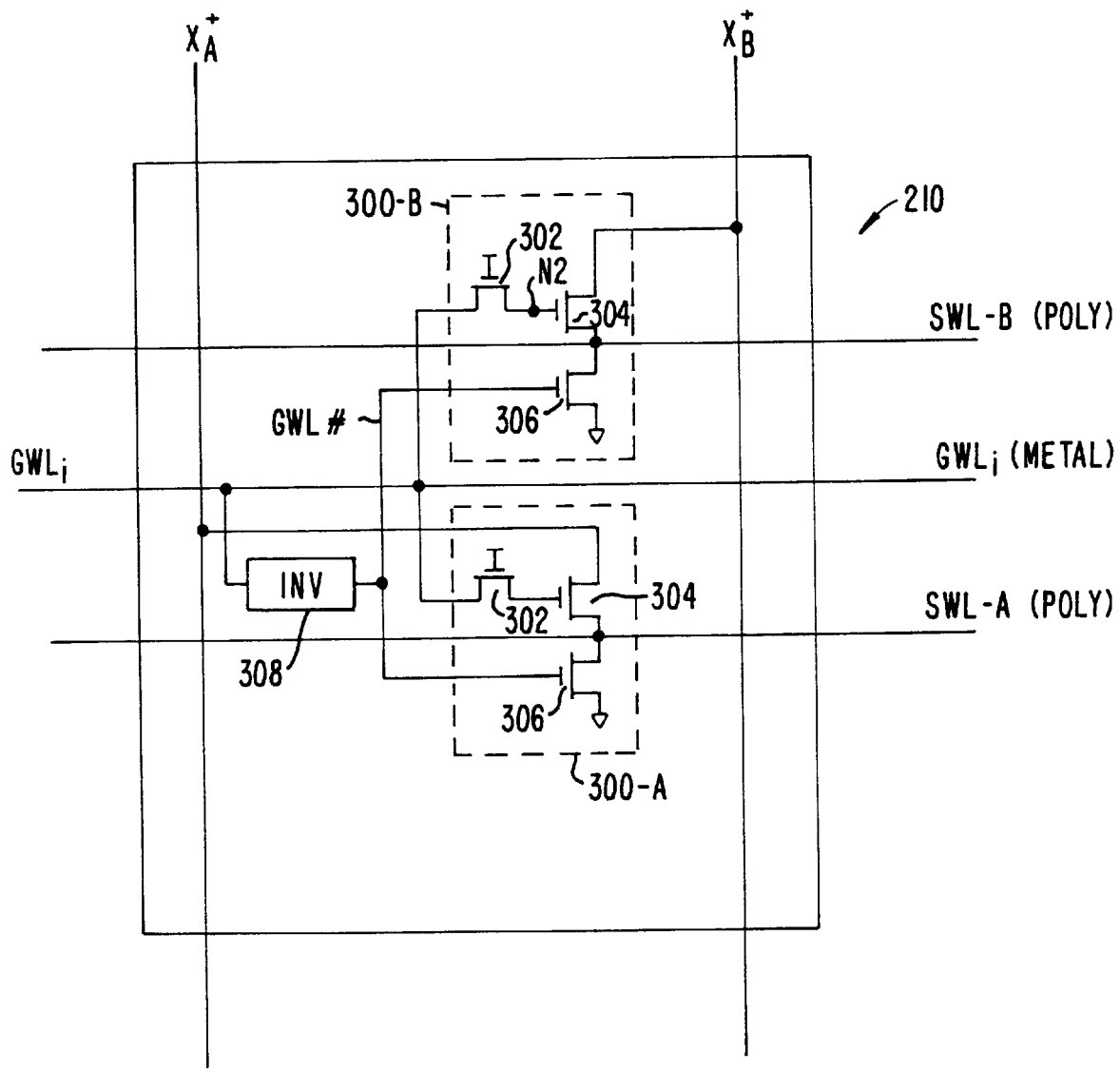
FIG. 3 is a circuit schematic of a sub-word line driver according to one embodiment of the present invention.

Referring to FIG. 3, there is shown one embodiment for a sub-word line driver (SWLD) circuit 210 according to the present invention. SWLD circuit 210 includes two internal drivers 300-A and 300-B driving sub-word lines SWL-A and SWL-B, respectively. Each internal driver includes an isolation transistor 302 that transfers the signal on GWL to the gate of bootstrap transistor 304 at node N2. The gate terminal of isolation transistor 302 may be coupled to the power supply Vcc, or alternatively to a boosted signal $V_x$.

Bootstrapping of charge at node N2 occurs when the bootstrap signal $X^+_B$ moves from a low voltage to a higher voltage. A bootstrapped voltage at node N2 shuts off isolation transistor 302, isolating node N2 from the signal on GWL. Thus, when, for example, SWL-B is to be selected, transistor 304 passes $X^+_B$ to SWL-B without the loss of a threshold voltage. A third transistor 306 receives the complement of the GWL signal (i.e., GWL#) at its gate. Transistor 306 thus pulls SWL-B to ground when GWL is not selected (i.e., GWL# is high), and is otherwise turned off when GWL is selected (i.e, GWL# is low).

The circuit of the present invention eliminates the need for routing across the entire array the complement of the global word line (i.e., the GWL# line) by including a local inverter inside each sub-word line driver circuit 210. As shown in FIG. 3, an inverting circuit INV 308 receives GWL at an input, inverts the signal and supplies GWL# to gate terminals of transistors 306 in each internal driver circuit 300. Power consumption, speed and area are among the factors that govern the design of inverting circuit INV 308. The present invention offers several embodiments for inverting circuit INV 308 that appreciably improve these performance characteristics. These embodiments are described hereinafter.

Figure 4:
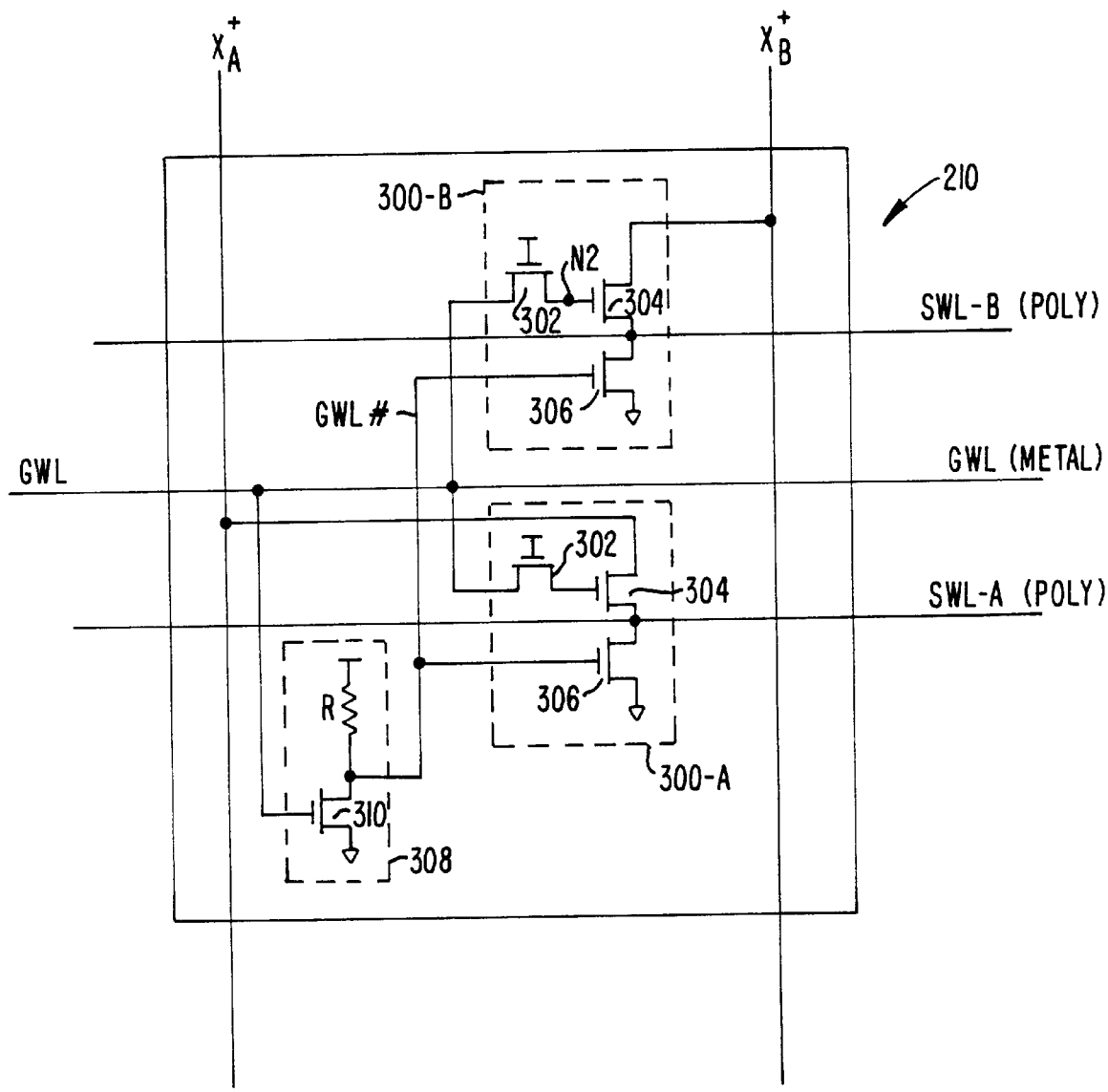
FIG. 4 shows an exemplary implementation for the sub-word line driver circuit with an NMOS inverter having a resistive load according to one embodiment of the present invention.

FIG. 4 shows a first embodiment for the sub-word line driver circuit that uses an NMOS inverter with a resistive load to implement inverting circuit INV 308. Inverting circuit 308 thus includes an NMOS pull-down transistor 310 that receives GWL at its gate, and a resistor R connected to the drain of transistor 310 which acts as the pull-up or load device. One advantage of this circuit is that it is implemented using NMOS transistors only. Not requiring PMOS transistors allows this circuit to be implemented in a relatively smaller area.

The resistance value of resistor R is determined by the trade off between power dissipation and recovery time of GWL# signal. The lower boundary for the value of R is given by the power consumption requirement when GWL# is low. For a selected GWL (i.e., GWL signal is high), GWL# signal is low. Under this condition standby current is dissipated through resistor R. Therefore, to reduce standby current, it is desirable to maximize the resistance value of R. On the other hand, the value of R should be high enough to ensure GWL# can be pulled down by transistor 310 below a threshold voltage of transistor 306, when needed. Given an on resistance of, for example, a few K ohms, for transistor 310, the value of R can thus be adjusted for proper operation.

Another factor that impacts the design of the inverter is the recovery time of the GWL# signal. An important function performed by transistor 306 in each SWL driver is to clamp the voltage on its respective SWL to ground when deselected. This reduces potential leakage current due to sub-threshold conduction when noise is coupled onto an unselected SWL by a neighboring selected SWL. To ensure that transistor 306 in a previously selected SWL driver is turned on before the next SWL is selected, places a time constraint on the recovery of the GWL# signal. That is, if in a given cycle, $GWL_i$ is selected ($GWL_i\#$ is low), after the completion of that cycle and before $GWL_{i+1}$ is selected (i.e., during row address strobe or RAS precharge time), $GWL_i\#$ should preferably return to a high voltage to turn on transistor 306 in the unselected SWL driver. The recovery time of the signal on the GWL# node is determined by the RC loading at the GWL# node. With the current state of the art, a typical RAS precharge time may be in the range of 20–30 nsec. Assuming, for illustrative purposes, a RAS precharge time of 30 nsec. and a total capacitance of 100fF at the GWL# node, the maximum resistance value for R would be 300 Kohms.

Figure 5:
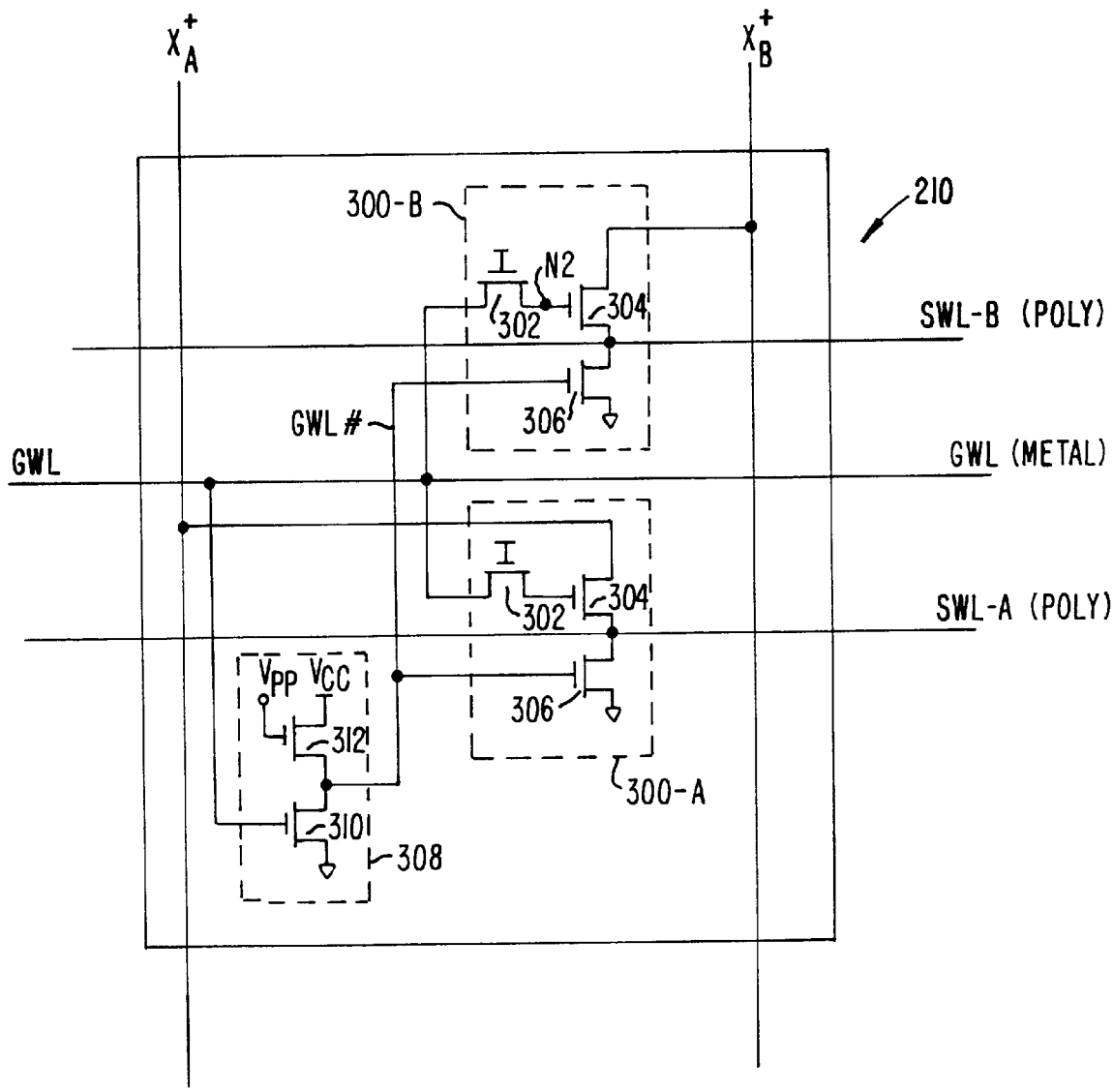
FIG. 5 shows another exemplary implementation of the sub-word line driver circuit with an NMOS inverter having an NMOS pull-up transistor according to another embodiment of the present invention.

In another embodiment, the present invention uses a transistor to implement the load device of inverting circuit INV 308. FIG. 5 shows a SWLD circuit wherein the resistor R of INV 308 is replaced by an NMOS transistor 312. In this embodiment, the gate terminal of NMOS transistor 312 connects to boosted voltage Vpp. This compensates for the threshold voltage of NMOS 312 and allows a full Vcc level to pass to GWL#. Transistor 312 can be as small as, for example, a DRAM memory cell access transistor. The effective on-resistance of NMOS transistor 312 can be adjusted by varying its size (W/L ratio). The area overhead due to INV 308 is minimal as NMOS transistors 310 and 312 are small in size, and a single INV 308 is shared by two internal sub-word line drivers 300-A and 300-B.

In the embodiment shown in FIG. 5, for a selected GWL, NMOS transistor 312 is on and drawing standby current throughout RAS active period. A variation of the embodiment shown in FIG. 5 further reduces the DC power dissipation of the SWLD circuit by switching load transistor 312. As discussed above, the clamping or hold-off function preformed by transistor 306 is aimed at reducing or eliminating the effect of cross-coupled noise from an adjacent SWL being selected. The time during which the cross-coupling of noise occurs, however, is limited to when the signal on a SWL switches state. After GWL switches state and a selected SWL also switches and reaches its final state, the signal on the SWL no longer contributes to any cross-coupling noise. Thus, it is possible to limit the clamping function to only the duration of noise coupling, instead of the entire RAS active period.

Figure 6:
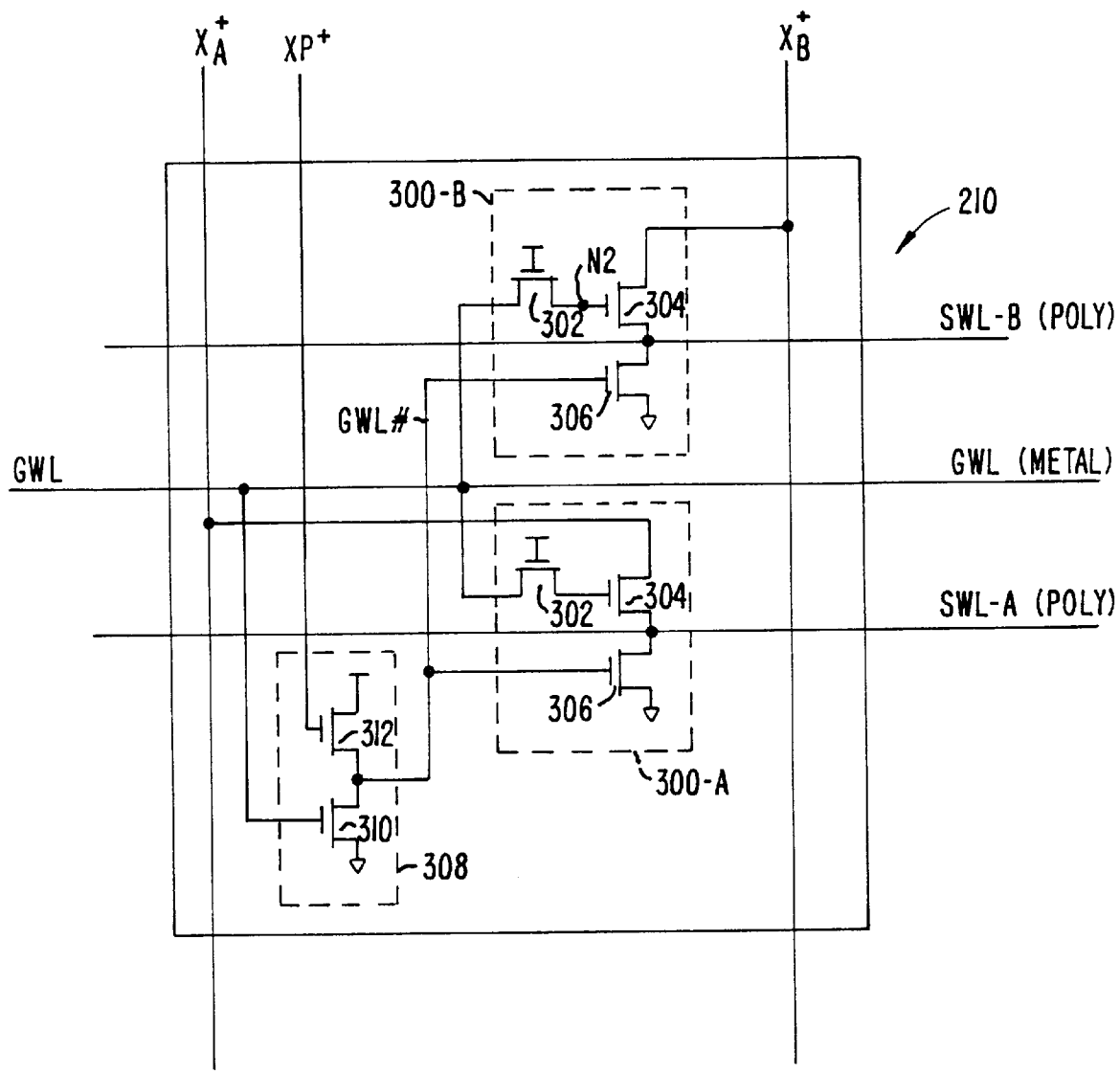
FIG. 6 shows a variation on the exemplary embodiment shown in FIG. 5 for the sub-word line driver circuit according to yet another embodiment of the present invention.
Figure 7:
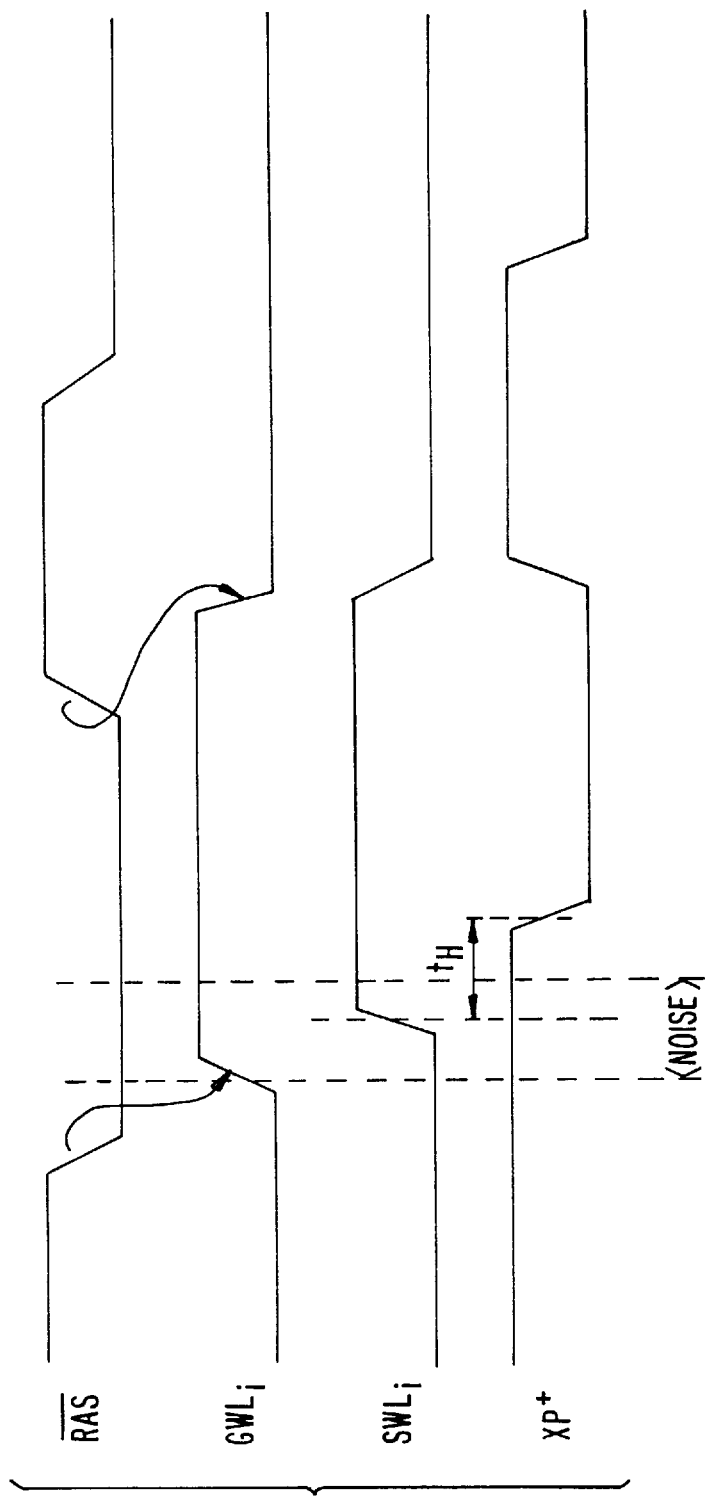
FIG. 7 is a timing diagram illustrating the operation of the exemplary embodiment of the sub-word line driver shown in FIG. 6.

In the embodiment shown in FIG. 6, the gate terminal of pull-up transistor 312 connects to an interconnect line carrying a signal $XP^+$, which has a boosted level when high. During standby mode, $XP^+$ is held at a high level to keep all GWL# signals high and SWLs clamped to ground. When a GWL is selected and its signal changes state to a high level, $XP^+$ remains initially at its high level. As pull-down transistor 310 is much stronger than the small and weaker transistor 312, in the selected SWLD, the signal on GWL# is pulled down to ground. The unselected GWLs remain low, turning their respective GWL# signals high (and transistor 306 on) for a solid clamping of the unselected SWLs. Up to this point the circuit operates much like the embodiment shown in FIG. 5, and dissipates DC current through NMOS load transistor 312. However, once the appropriate $X^+_A$ arrives and the selected SWL reaches its final high value, there is no longer a need for a clamping function. Transistor 312 can thus be turned off at this time. This is accomplished by switching the signal on $XP^+$ from a boosted high level to a low enough level to turn off transistor 312, well before the end of the RAS active period. The timing diagram illustrating the operation of the circuit of FIG. 6 is shown in FIG. 7. This embodiment of the present invention, therefore, limits DC current dissipation to a smaller window (because of reduced $t_H$), instead of during the entire RAS active period.

Figure 8:
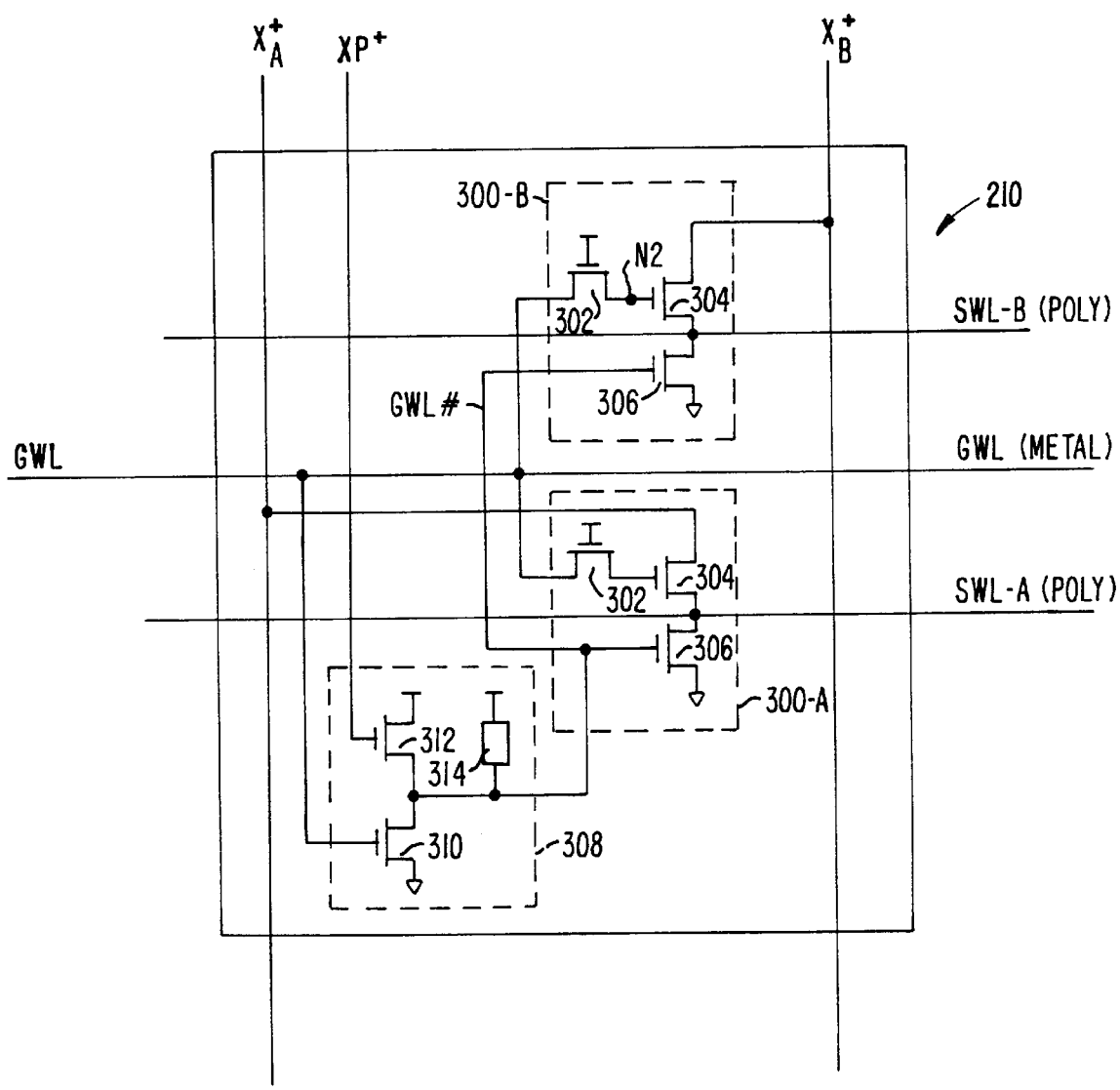
FIG. 8 is yet another exemplary embodiment of the sub-word line driver circuit of the present invention.

Yet another embodiment of the present invention implements the pull-up load device for inverter INV 308 by combining a switched load transistor with an additional resistive load device. FIG. 8 shows this embodiment of the present invention which is similar to that shown in FIG. 6, but includes an additional resistive element 314 pulling GWL# up to a high voltage. With the inclusion of a static pull-up (resistive element 314), there is no time during which GWL# is left floating. This removes the on/off timing restrictions for transistor 312 as described in connection with FIGS. 6 and 7. Thus, NMOS 312 can be turned on or off according to whether a given array is selected. More specifically, in this embodiment, the only timing requirement is that for a selected array, the signal $XP^+$ switch to a low level turning NMOS transistor 312 off, before the selected GWL switches to a high level.

Further, as discussed above, the GWL# recovery time sets the limit for the maximum value of resistance of resistive element 314. In this embodiment, however, because the recovery time is determined by pull-up NMOS transistor 312, the maximum restriction on the resistance value of resistive element 314 is removed. Thus, resistive element 314 may have as high a resistance value as the area requirements allow. A much higher resistance for the static pull-up reduces standby current significantly as compared to the embodiments shown in FIGS. 4 and 5. Resistive element 314 may be implemented using a resistor or preferably a very small transistor (e.g., the size of a DRAM cell access transistor) that exhibits on-resistances as high as or greater than, for example, one Megaohm.

The embodiment shown in FIG. 8, thus improves the current consumption as compared to the embodiments in FIGS. 4 and 5, and is also an improvement on the embodiment shown in FIG. 6 with respect to certain circuit layout considerations. Specifically, for the embodiment shown in FIG. 6, every array requires an extra interconnect line carrying the $XP^+$ signal which is routed through the bit line sense amplifier region. Since $XP^+$ has its own timing requirements in the embodiment of FIG. 6, a separate interconnect line in each array is dedicated for this signal. As discussed above, the embodiment shown in FIG. 8 simplifies the timing requirement for the $XP^+$ signal such that $XP^+$ is switched low for a selected array before GWL switches high. In conventional DRAM circuitry, the signal that precharges bit lines has the exact same timing characteristics. Thus, in this embodiment, no new interconnect line and timing circuitry need be added which saves area.

The present invention, therefore, provides various embodiments for a hierarchical word line structure for high density memory circuits that reduces power dissipation and area. According to the present invention, a single non-boosted global word line is routed across a memory array and sub-word line drivers located at various intervals drive segmented sub-word lines in the array. Thus, by having one global metal word line drive multiple polysilicon sub-word lines, the present invention makes possible implementation of memory arrays with higher density. The invention achieves lower power consumption and smaller area by inverting the signal on the global word line locally inside each sub-word line driver. A single inverting circuit is shared by more than one polysilicon word line driver circuits.

While the above is a complete description of the preferred embodiments of the present invention, it is possible to use various alternatives, modifications and equivalents. For example, the word line architecture of the present invention is described in the context of a DRAM circuit having an exemplary array size. However, applicability of the techniques of the present invention is not dependent on the memory size or the type of memory circuit. Also, the exemplary architecture used to illustrate the principles of the present invention shows a metal pitch that accommodates four polysilicon sub-word lines. However, similar techniques may be employed to interpose a greater number of sub-word lines between global word line to further relax the metal pitch requirement (or fewer sub-word lines if desired). A greater number of sub-word lines can be driven by each sub-word line driver by, for example, including more than two internal drivers in each sub-word line driver and supplying each sub-word line driver with more than two $X^+$ signals. Further, alternative materials to metal and polysilicon may be used to route the global word lines and the sub-word lines. Therefore, the scope of the present invention should be determined not with reference to the above description but should, instead, be determined with reference to the appended claims, along with their full scope of equivalents.

What is claimed is:

1. A memory circuit comprising:

an array of memory having a plurality of memory cells respectively located at intersections of a plurality of columns and a plurality of rows, each row being divided into a plurality of segments of sub-word lines;

a row decoder having inputs coupled to receive row address information and an output coupled to a global word line; and a plurality of sub-word line drivers respectively located at various intervals along each row, each sub-word line driver having an input coupled to a respective global word line and an output coupled to a respective sub-word line, wherein, said sub-word line driver comprises an inverting circuit for locally inverting a signal on said respective global word line, wherein said inverting circuit comprises an NMOS pull-down transistor having a gate terminal coupled to said respective global word line and a source/drain terminal coupled to a pull-up device, and wherein said pull-up device comprises an MOS transistor having a gate terminal coupled to a control signal, and wherein said control signal switches said MOS transistor ON and OFF according to a predefined timing.

2. The memory circuit of claim 1 wherein said predefined timing is defined by a time period during which a signal on said global word line and a signal on said sub-word line switch state.

3. The memory circuit of claim 1 wherein said MOS transistor is ON during a first part of an active cycle when said signal on said global word line and said signal on said sub-word line switch states, and OFF during a second part of an active cycle when said signal on said global word line and said signal on said sub-word line reach a final value.

4. The memory circuit of claim 1 wherein said inverting circuit further comprises a static pull-up element.

5. The memory circuit of claim 4 wherein said static pull-up element is a resistor.

6. The memory circuit of claim 4 wherein said static pull-up element is an MOS transistor having a gate terminal coupled to a logic high voltage.

7. The memory circuit of claim 4 wherein said MOS transistor is on before a global word line is selected, and turns off after the start of an active cycle and before said signal on said global word line switches state.

8. A memory circuit comprising:

an array of memory having a plurality of memory cells respectively located at intersections of a plurality of columns and a plurality of rows, each row being divided into a plurality of segments of sub-word lines;

a row decoder having inputs coupled to receive row address information and an output coupled to a global word line; and a plurality of sub-word line drivers respectively located at various intervals along each row, each sub-word line driver having an input coupled to a respective global word line and an output coupled to a respective sub-word line, wherein, said sub-word line driver comprises: a first transistor coupled to said respective sub-word line;

an inverting circuit for locally inverting a signal on said respective global word line and driving a gate terminal of said first transistor;

a first internal driver circuit having a first input coupled to a respective global word line, a second input coupled to an output of said inverting circuit, and an output coupled to a first sub-word line; and a second internal driver circuit having a first input coupled to said respective global word line, a second input coupled to said output of said inverting circuit, and an output coupled to a second sub-word line.

9. The memory circuit of claim 8 wherein said first internal driver circuit comprises said first transistor and further comprises:

a second transistor having a first source/drain terminal coupled to said respective global word line, a second source/drain terminal coupled to a boost node, and a gate terminal; and a third transistor having a first source/drain terminal coupled to said first sub-word line, a second source/drain terminal coupled to a select line, and a gate terminal coupled to said boost node;

wherein, said first transistor has a first source/drain terminal coupled to said first sub-word line, a second source/drain terminal coupled to a reference level, and a gate terminal coupled to said output of inverting circuit.

10. The memory circuit of claim 1 wherein each sub-word line driver receives one global word line and drives at least two sub-word lines, and wherein said global word line is of metallic material and said at least two sub-word lines are of polysilicon material.

11. The memory circuit of claim 10 wherein said at least two sub-word lines extend on both sides of each sub-word line driver along a longitudinal axis of said memory array.

12. In a memory circuit having an array of memory cells, a sub-word line driver comprising:

a first internal driver circuit having a first input coupled to a global word line made of metal, said global word line substantially traversing along an entire row in the array of memory cells, said first internal driver further having an output coupled to a first sub-word line made of polysilicon, said first sub-word line being coupled to a first subset of memory cells along one row of the array;

a second internal driver circuit having a first input coupled to said global word line, and an output coupled to a second sub-word line made of polysilicon, said second sub-word line being coupled to a second subset of memory cells along one row of the array; and an inverting circuit having an input coupled to said global word line and an output coupled to a second input of said first internal driver circuit and a second input of said second internal driver circuit.

13. The memory circuit of claim 12 wherein each of said first and second internal driver circuits comprises:

a first transistor coupled between a boost node and a respective sub-word line, said first transistor having a gate terminal being driven by a signal on said global word line; and a second transistor coupled between said respective sub-word line and a reference node, said second transistor having a gate terminal being driven by said output of said inverting circuit.

14. The memory circuit of claim 13 wherein said inverting circuit comprises:

an n-channel pull-down transistor coupled between said output of said inverting circuit and a source of low potential, said n-channel pull-down transistor having a gate terminal coupled to said global word line; and an n-channel pull-up transistor coupled between said output of said inverting circuit and a first node, said n-channel pull-up transistor having a gate terminal coupled to receive a control signal.

* * * * *